United States Patent [19]

Hasegawa

[11] Patent Number: 5,460,992
[45] Date of Patent: Oct. 24, 1995

[54] FABRICATING NON-VOLATILE MEMORY DEVICE HAVING A MULTI-LAYERED GATE ELECTRODE

[75] Inventor: Eiji Hasegawa, Tokyo, Japan

[73] Assignee: NEC Corporation, Japan

[21] Appl. No.: 438,778

[22] Filed: May 11, 1995

[30] Foreign Application Priority Data

May 25, 1994 [JP] Japan .................................. 6-110649

[51] Int. Cl.⁶ .............................................. H01L 21/8247
[52] U.S. Cl. ........................... 437/43; 437/242; 437/978; 148/DIG. 114
[58] Field of Search ............................. 437/42, 43, 241, 437/242, 978; 148/DIG. 112, DIG. 114

[56] References Cited

U.S. PATENT DOCUMENTS 4,980,307  12/1990  Ito et al. .................................. 437/242
5,407,870   4/1995  Okada et al. ............................ 437/242
5,422,291   6/1995  Clementi et al. ........................ 437/43

Primary Examiner—Chandra Chaudhari
Attorney, Agent, or Firm—Hayes, Soloway, Hennessey, Grossman & Hage

[57] ABSTRACT

A non-volatile memory device with a multi-layered gate electrode structure is fabricated by forming a floating gate electrode and a thermally oxidized silicon film on surfaces inclusive of a surface of the multi-layered gate electrode structure having a control gate electrode, and then forming, by a thermal nitrifying treatment, a thermally nitrified oxidized silicon film at an interface between the thermally oxidized silicon film and the multi-layered gate electrode structure. Diffusion of impurity into a multi-layered gate electrode structure of the memory is prevented and also leakage current due to mismatching at the film interface is reduced.

4 Claims, 4 Drawing Sheets

5,460,992

FABRICATING NON-VOLATILE MEMORY DEVICE HAVING A MULTI-LAYERED GATE ELECTRODE

BACKGROUND OF THE INVENTION

1. Field of the Invention

The present invention relates to a non-volatile memory device and a method for fabricating the same.

2. Description of the Related Art

The performance of ULSI devices greatly depends on the performance of a gate oxide film, and a basic problem is how to form a highly reliable gate oxide film. The fact that the formation of the gate oxide film is a key process in device manufacture even today is attributable to possible deterioration of the oxide film due to various causes. Specifically, the oxide film is greatly influenced not only by the conditions of its formation but also by the pre- and post-processes as well as its structure. For these reasons, there have been attempts to develop oxide films which are robust against external causes and not easily affected by external influences.

Many current devices use inter-layer insulating films. In addition, various methods have been tried for forming an oxide film as an insulating film, for instance, a CVD (Chemical Vapor Deposition) process for forming BPSG (Boro-Phospho-Silicate Glass) films, PSG films, BSG films, etc. However, these inter-layer insulating films contain, in addition to a high water content, additional impurities such as boron and phosphorus, thus posing a problem that these impurities diffuse even as far as the gate oxide film, leading to a deterioration of reliability. Therefore, a means for preventing such diffusion is necessary.

FIG. 1 shows, in a sectional view, a prior art example of a non-volatile memory device.

The memory device shown in FIG. 1 comprises a multi-layered structure of memory gate electrodes (hereinafter referred to as a "multi-layered gate electrode structure"), which is formed on a p-type silicon substrate 1 by depositing sequentially from a bottom a first gate insulating film 2, a floating gate electrode 3, a second gate insulating film 4, and a control gate electrode 5; a source/drain diffusion layer 6 which is formed in surface regions of the silicon substrate 1 by ion-implantation of an n-type impurity and which is self-aligned with the multi-layered gate electrode structure; an oxidized silicon film 11 formed on the side surfaces of the gate electrode structure; a nitrified silicon film 12 deposited by the CVD process on surfaces inclusive of surfaces of the gate electrode structure and the source/drain diffusion layer 6; and an inter-layer insulating film 10, such as a BPSG film, formed on the nitrified silicon film 12. With the provision of the nitrified silicon film 12, it is possible to prevent the diffusion of the water and such impurities as boron and phosphorus from the inter-layer insulating film 10 into the gate insulating film thereby preventing the device operation from becoming unstable due to trapping of electrons or generation of dangling bonds. In addition, the nitrified silicon film 12 is formed on the surface of the source/drain diffusion layer 6 either directly or with a thin thermally oxidized silicon film being interposed therebetween. By setting the thickness of the thermally oxidized silicon film to be between 0 and 100 nm, it is possible to block the entry of sodium (Na) ions through contact hole 13 (refer to Japanese Patent Application Kokai Publication No. Hei 1-164069).

This prior art semiconductor device has a problem that the memory section is subjected to a very high stress caused by the deposited nitrified silicon film. If the deposition surface is flat and the deposited nitrified silicon film is sufficiently thin, the stress applied to the section on which the deposition is made is not so high. However, with deposition of nitrified silicon film on a portion having a large step, such as on the multi-layered gate electrode structure of a non-volatile memory device, great strain is generated in the covered electrode and the insulating film, leading to an increased leakage in the insulating film and deterioration of the reliability of the device. Further, in the case of depositing a nitrified silicon film on the thermally oxidized silicon film, many inter-atomic mismatches develop at the interface between the thermally oxidized film and the nitrified silicon film so that there is tendency for a leakage current to flow through such an interface. This is a fatal problem in the non-volatile memory device.

SUMMARY OF THE INVENTION

An object of the invention, therefore, is to overcome the problems existing in the prior art and to provide a non-volatile memory device, which can prevent impurity diffusion into a multi-layered gate electrode structure and also reduce a leakage current caused by stress or interface mismatching, thus permitting improvement of the reliability of the memory device.

According to one aspect of the invention, there is provided a non-volatile memory device with a multi-layered gate electrode structure having a first gate insulating film, a floating gate electrode, a second gate insulating film and a control gate electrode which are sequentially deposited on a semiconductor substrate, characterized in that the non-volatile memory device includes a composite insulating film which is formed of a combination of an oxidized silicon film, thermally nitrified oxidized silicon film and an oxidized silicon film, and which covers surfaces inclusive of a surface of the multi-layered gate electrode structure.

According to another aspect of the invention, there is provided a method for fabricating a non-volatile memory device comprising the steps of:

forming a floating gate electrode by depositing a polycrystalline silicon film on a first gate insulating film constituted by an oxidized silicon film formed on a semiconductor substrate and patterning the polycrystalline silicon film thus formed;

forming, by a thermally nitrifying treatment, a thermally nitrified silicon film on a surface of the floating gate electrode and simultaneously forming a thermally nitrified oxidized silicon film at an interface between the oxidized silicon film on the semiconductor substrate and the semiconductor substrate;

forming, by a thermally oxidizing treatment, a thermally oxidized silicon film at an interface between the thermally nitrified silicon film and the floating gate electrode and also at an interface between the thermally nitrified oxidized silicon film and the semiconductor substrate; and forming a control gate electrode aligned to the floating gate electrode by depositing a polycrystalline silicon film on surfaces inclusive of a-surface of the thermally nitrified silicon film and patterning the polycrystalline silicon film deposited.

According to the invention, by covering the surface of the multi-layered gate electrode structure of the non-volatile memory device with the composite insulating film including the thermally nitrified oxidized silicon film, it is possible to prevent impurity diffusion from the inter-layer insulating film or from the outside and also to prevent the leakage current which is otherwise caused by the mismatching at the interface, thus enhancing the reliability of the semiconductor device.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

The embodiments of the invention will now be described with reference to the drawings.

Figure 2A:
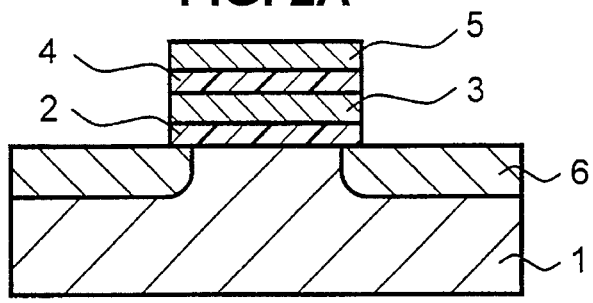
FIGS. 2A to 2D are sectional views illustrating successive steps in a method for fabricating a device of a first embodiment according to the invention.

FIGS. 2A to 2D illustrate a non-volatile memory device of the first embodiment according to the invention. First, as shown in FIG. 2A, a device formation region is defined with a device isolation layer (not shown) formed on one principal surface of a p-type silicon substrate 1. Then, a first gate oxide film (tunnel gate insulating film) 2 is formed by thermal oxidation of a surface portion of the silicon substrate 1 in the device formation region. Then, a floating gate electrode 3 is formed by depositing a polycrystalline silicon film on the film 2. Then, a second gate insulating film 4 is formed by thermal oxidation of a surface portion of the floating gate electrode 3. Then, a control gate electrode 5 is formed by depositing a polycrystalline silicon film on the second gate oxide film 4. The films 2 to 5 thus deposited are then selectively etched, thus forming a multi-layered gate electrode structure. Subsequently, an n-type impurity, for instance, boron (B) or phosphorus (P), is ion-implanted into a surface portion of the silicon substrate 1 with the multi-layered gate electrode structure used as a mask, thus forming a source/drain diffusion layer 6.

Figure 2B:
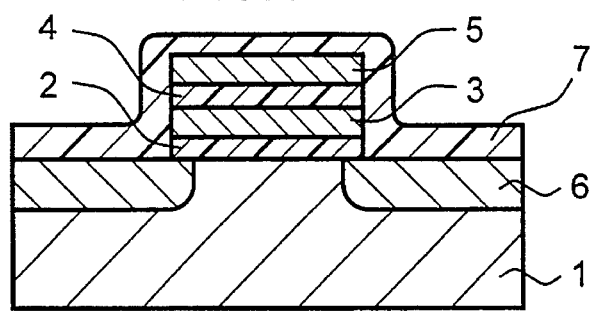

Subsequently, a thermal oxidation treatment is carried out in an oxygen gas under atmospheric pressure and at a temperature of 900° C., thus forming a thermally oxidized silicon film 7 on the surfaces of the multi-layered gate electrode structure and source/drain diffusion layer 6, as shown in FIG. 2B.

Figure 2C:
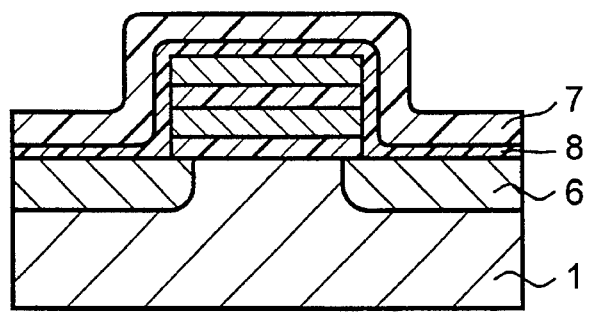

Then, as shown in FIG. 2C, a thermal nitrifying treatment is carried out in an ammonia gas under atmospheric pressure and at a temperature of 950° C. for 60 seconds, thus forming a nitrified oxidized silicon film 8 at the interface between the thermally oxidized silicon film 7 and the multi-layered gate electrode structure and source/drain diffusion layer 6.

Figure 2D:
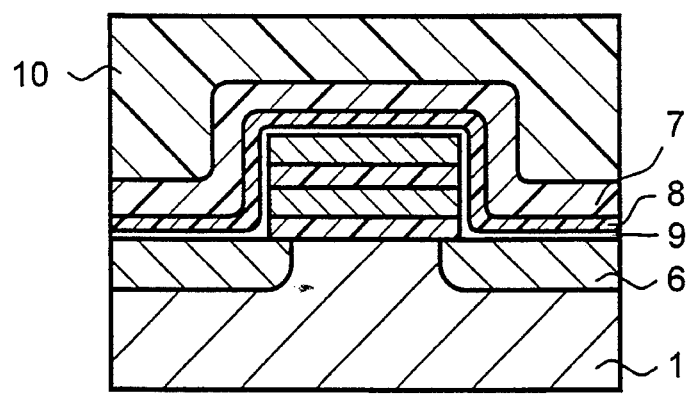

Then, a thermally oxidizing treatment is carried out again in an oxygen gas under atmospheric pressure and at a temperature of 1,150° C. for 60 seconds, thus forming a thin thermally oxidized silicon film 9 at the interface between the nitrified oxidized silicon film 8 and the multi-layered gate electrode structure and source/drain diffusion layer 6, as shown in FIG. 2D. Thus, a composite insulating film is formed, which comprises the thermally oxidized silicon film 7, nitrified oxidized silicon film 8 and thermally oxidized silicon film 9. Then, an inter-layer insulating film 10 constituted by a BPSG film or the like is formed on the composite insulating film.

The thickness of the nitrified oxidized silicon film 8 is about 3 nm, that of the thermally oxidized silicon film 9 is about 2 nm, and that of the overall composite insulating film is about 18 nm.

By carrying out the thermally nitrifying and thermally oxidizing treatments again on the thermally oxidized silicon film 7, a nitrified oxidized silicon film and an oxidized silicon film are formed also on the outer surface of the thermally oxidized silicon film 7 with the resulting films having the same function as that of the films formed by the first treatments. Description concerning this is omitted for the brevity of the description.

Figure 1:
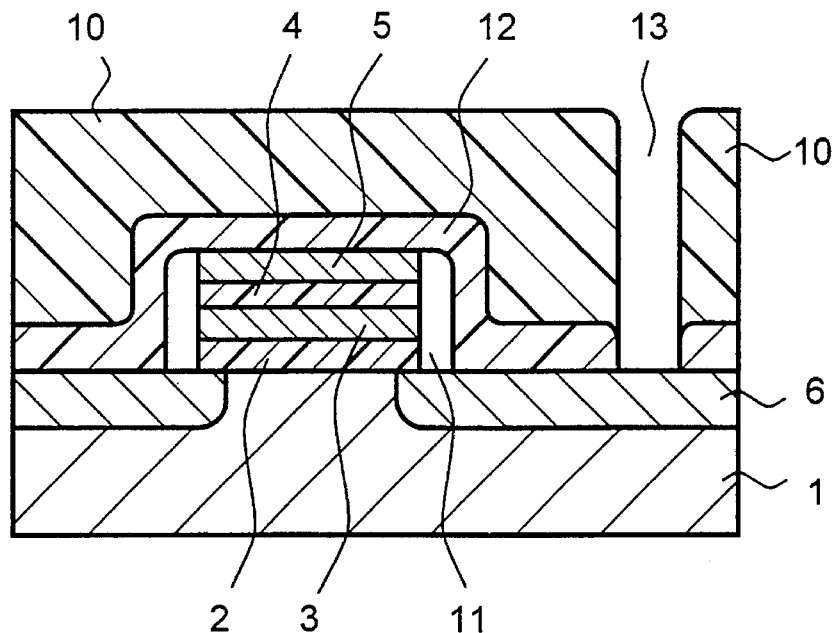
FIG. 1 is a sectional view showing a prior art example of a non-volatile memory device.
Figure 3:
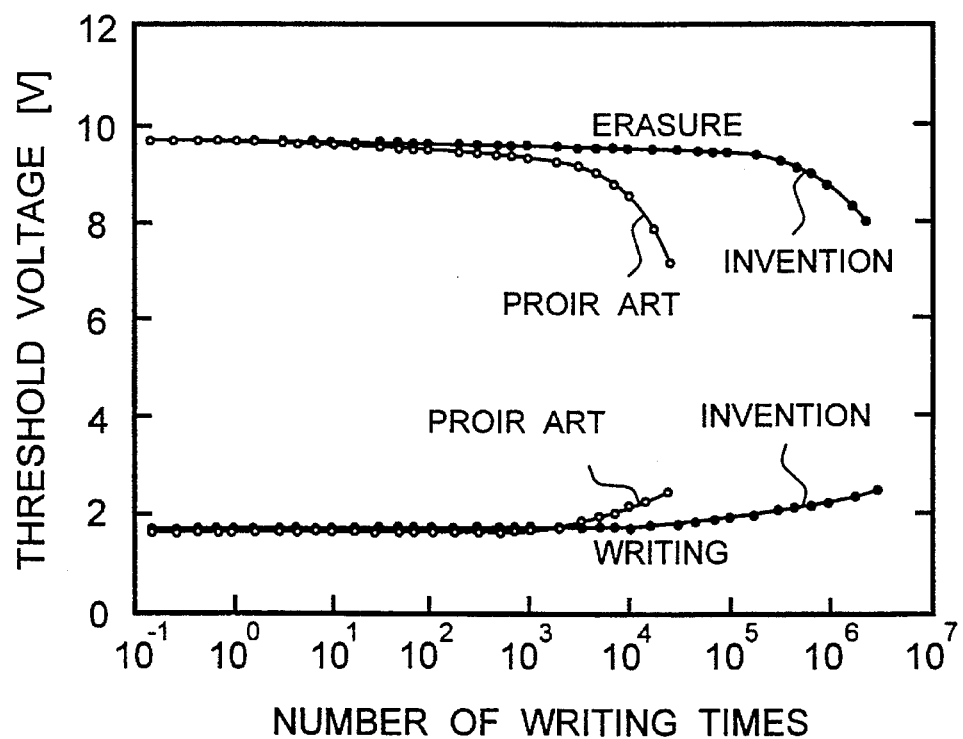
FIG. 3 is a graph showing changes in threshold voltages depending on the number of writing times in a non-volatile memory device adopting the first embodiment of the invention.

FIG. 3 is a graph showing changes in threshold voltages depending on the number of writing times (i.e., the number of recurring writing and erasing times) in a non-volatile memory device adopting the first embodiment of the invention.

As is seen from the graph, the number of writing times without changes in the value of the threshold voltage is significantly increased with the non-volatile memory device according to the invention compared to the prior art example (which is a combination of an oxidized silicon film and a deposited nitrified silicon film). This marks a great improvement in the reliability of the memory device.

Figure 4:
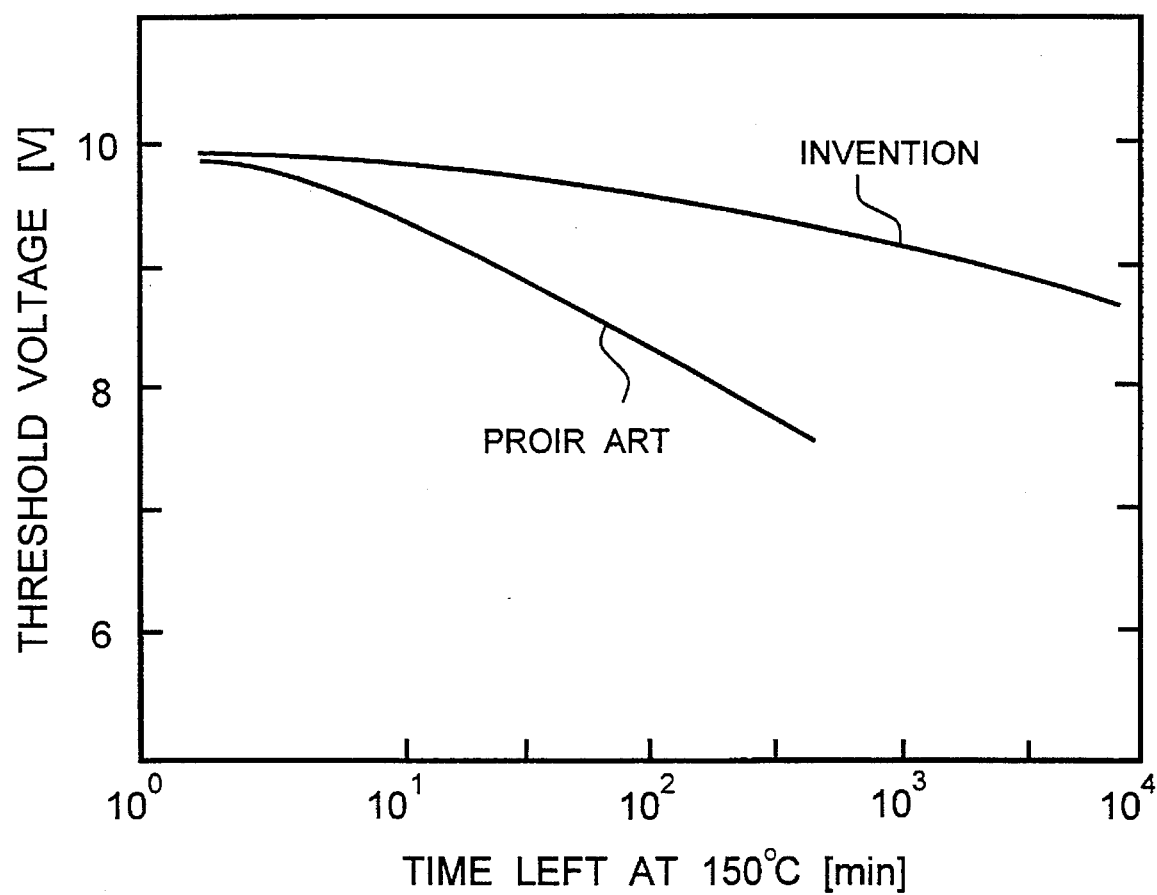
FIG. 4 is a graph showing memory holding characteristics of a non-volatile memory device adopting the first embodiment of the invention.

FIG. 4 is a graph showing memory holding characteristics of a non-volatile memory device adopting the first embodiment of the invention.

In this instance, the memory device which is set to a write state by the injection of electrons into the floating gate electrode is left alone in an atmosphere of 150° C. As is seen from the graph of FIG. 4, the changes in the threshold voltage with the non-volatile memory device according to the invention are significantly small compared to the prior art example. This means that according to this invention the leakage current is very small.

The thermally oxidized silicon film 7 may be replaced by an oxidized silicon film formed by the CVD process. In the subsequent steps of manufacture, the thermally nitrified oxidized silicon film 8 and thermally oxidized silicon films 9 are formed at the interface of the gate electrode or of the silicon substrate, and the mismatching at the interface can be eliminated in these steps.

In some cases, it is possible to omit the second oxidizing process. The purpose of the second oxidizing process is to remove hydrogen atoms which are inevitably introduced when the nitrified oxidized silicon film is formed with ammonia gas, for instance. To attain the interface matching, the nitrified oxidized silicon film only is sufficient. If the purpose is only to remove the hydrogen atoms, this can be met by a subsequently performed thermal treatment at a temperature of 700° to 1200° C. for about 30 seconds to one minute, and thus it is possible to omit the second oxidizing process. In this case, the composite insulating film has a two-layer structure comprising an upper oxidized silicon film and a nitrified oxidized silicon film at the interface.

Further, as the gas used in the thermally nitrifying process, use may be made of suboxidized nitrogen gas instead of ammonia gas.

FIGS. 5A to 5D are sectional views of a device for explaining the steps in the method for fabrication of the second embodiment according to the invention.

Figure 5A:
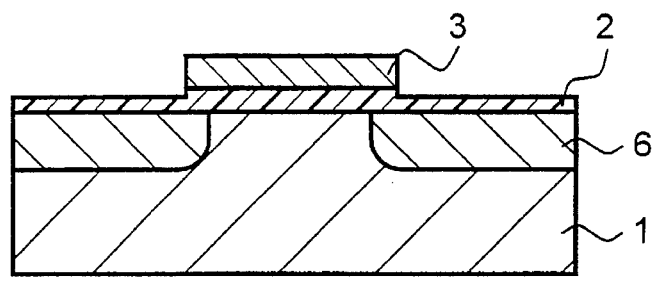
FIGS. 5A to 5D are sectional views illustrating successive steps in a method for fabricating a device of a second embodiment according to the invention.

As shown in FIG. 5A, similarly as in the first embodiment, a first gate oxide film 2 is formed on the surface of a device formation region formed in one main surface of p-type silicon substrate 1. Then, a floating gate electrode 3 is formed by forming a polycrystalline silicon film on the first gate oxide film 2 and patterning the film. Then, a source/drain diffusion layer 6 is formed by ion-implantation of an n-type impurity into the silicon substrate 1 with the floating gate electrode 3 used as a mask.

Figure 5B:
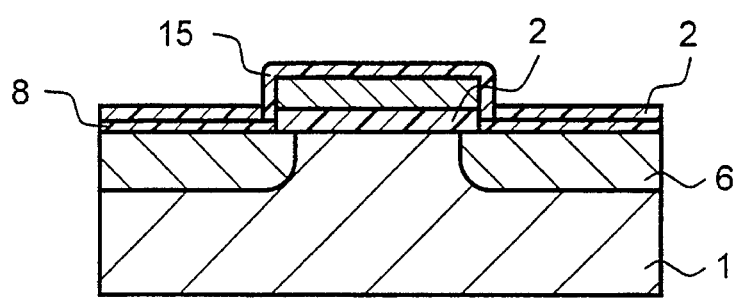

Subsequently, a thermally nitrifying treatment using ammonia gas is carried out to form a thermally nitrified silicon film 15 on the surface of the floating gate electrode 3 and also to form a thermally nitrified oxidized silicon film 8 on the surface of the source/drain diffusion layer 6, as shown in FIG. 5B.

Figure 5C:
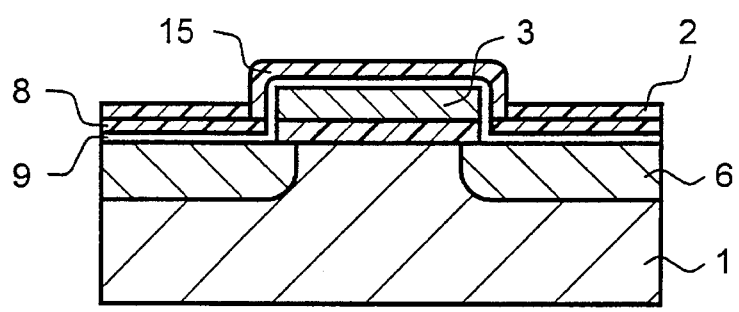

Then, a thermally oxidizing treatment in an oxygen gas atmosphere is carried out again to form a thin thermally oxidized silicon film 9 at the interface between the thermally nitrified silicon film 15 and the floating gate electrode 3 and also at the interface between the thermally nitrified oxidized silicon film 8 and the source/drain diffusion layer 6, as shown in FIG. 5C. Thus, a second gate insulating film is formed, which is constituted by the thermally nitrified and thermally oxidized silicon films 15 and 9.

Figure 5D:
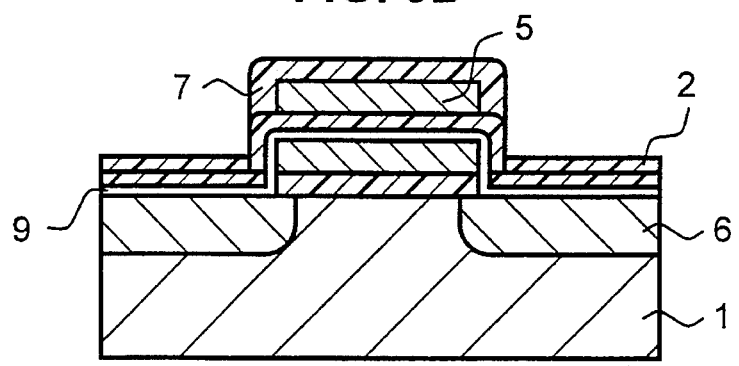

Then, as shown in FIG. 5D, a control gate electrode 5 aligned to the floating gate electrode 3, is formed by depositing a polycrystalline silicon film on the surface inclusive that of the second gate insulating film and, thereafter patterning the film. Then, a thermally oxidized silicon film 7 is formed by thermal oxidization of a surface portion of the control gate electrode 5. In this way, a multi-layered gate electrode structure for a non-volatile memory device is formed.

It will be seen that, with this embodiment in which only the first gate insulating film 2 (i.e., a tunnel insulating film) and the floating gate electrode 3 are covered by the composite insulating film including the thermally nitrified silicon film, it is possible to prevent impurity diffusion and interface leakage, thus enhancing the reliability of the non-volatile memory device.

While the invention has been described in its preferred embodiments, it is to be understood that the words which have been used are words of description rather than limitation and that changes may be made without departing from the true scope and spirit of the invention in its broader aspects.

What is claimed is:

1. A method for fabricating a non-volatile memory device comprising the steps of:

forming, on a semiconductor substrate, a multi-layered gate electrode structure by sequentially depositing a first gate insulating film, a floating gate electrode constituted by a polycrystalline silicon film, a second insulating film, and a control electrode constituted by a polycrystalline silicon film;

forming a first oxidized silicon film on surfaces inclusive of a surface of said multi-layered gate electrode structure;

forming, by a thermally nitrifying treatment, a thermally nitrified oxidized silicon film at an interface between said first oxidized silicon film and said multi-layered gate electrode structure and semiconductor substrate; and forming, by a thermally oxidizing treatment, a second oxidized silicon film at an interface between said thermally nitrified oxidized silicon film and said multi-layered gate electrode structure and semiconductor substrate.

2. A method for fabricating a non-volatile memory device comprising the steps of:

forming a floating gate electrode by depositing a polycrystalline silicon film on a first gate insulating film constituted by an oxidized silicon film formed on a semiconductor substrate and patterning the polycrystalline silicon film thus formed;

forming, by a thermally nitrifying treatment, a thermally nitrified silicon film on a surface of said floating gate electrode and simultaneously forming a thermally nitrified oxidized silicon film at an interface between said oxidized silicon film on said semiconductor substrate and said semiconductor substrate;

forming, by a thermally oxidizing treatment, a thermally oxidized silicon film at an interface between said thermally nitrified silicon film and said floating gate electrode and also at an interface between said thermally nitrified oxidized silicon film and said semiconductor substrate; and forming a control gate electrode aligned to said floating gate electrode by depositing a polycrystalline silicon film on surfaces inclusive of a surface of said thermally nitrified silicon film and patterning said polycrystalline silicon film deposited.

3. The method for fabricating a non-volatile memory device according to claim 1, in which said semiconductor substrate is of a p-type and in which an n-type impurity is ion-implanted into a surface portion of said semiconductor substrate using said multi-layered gate electrode structure as a mask thereby forming a source/drain diffusion layer.

4. The method for fabricating a non-volatile memory device according to claim 2, in which said semiconductor substrate is of a p-type and in which an n-type impurity is ion-implanted into a surface portion of said semiconductor substrate using said floating gate electrode as a mask thereby forming a source/drain diffusion layer.

* * * * *